(12) United States Patent
Chua et al.

(10) Patent No.: US 8,722,545 B2
(45) Date of Patent: May 13, 2014

(54) METHOD OF SELECTIVELY DEGLAZING P205

(75) Inventors: Hong-Gap Chua, Singapore (SG); Yee-Chung Chan, Singapore (SG); Mei-Yu Muk, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/595,933

(22) Filed: Aug. 27, 2012

(65) Prior Publication Data
US 2014/0054727 A1    Feb. 27, 2014

(51) Int. Cl.
*H01L 21/302*    (2006.01)
*H01L 21/22*    (2006.01)

(52) U.S. Cl.
USPC ........... 438/745; 438/542; 438/563; 438/689; 257/E21.244; 257/E21.228; 257/E21.619; 257/E21.634

(58) Field of Classification Search
None
See application file for complete search history.

(56) References Cited

U.S. PATENT DOCUMENTS

| 5,712,176 A * | 1/1998 | Lytle et al. ..................... 438/301 |
| 2010/0319771 A1* | 12/2010 | Mihailetchi et al. .......... 136/258 |
| 2012/0052618 A1* | 3/2012 | Inns ................................. 438/87 |
| 2013/0095597 A1* | 4/2013 | Park et al. ....................... 438/72 |

* cited by examiner

*Primary Examiner* — Julio J Maldonado
*Assistant Examiner* — Harpreet Singh
(74) *Attorney, Agent, or Firm* — Seed IP Law Group PLLC

(57) ABSTRACT

A method of forming a transistor is disclosed, in which gate-to-substrate leakage is addressed by forming and maintaining a conformal oxide layer overlying the transistor gate. Using the method disclosed for an n-type device, the conformal oxide layer can be formed as part of the source-drain doping process. Subsequent removal of residual phosphorous dopants from the surface of the oxide layer is accomplished without significant erosion of the oxide layer. The removal step uses a selective deglazing process that employs a hydrolytic reaction, and an acid-base neutralization reaction that includes an ammonium hydroxide component.

16 Claims, 7 Drawing Sheets

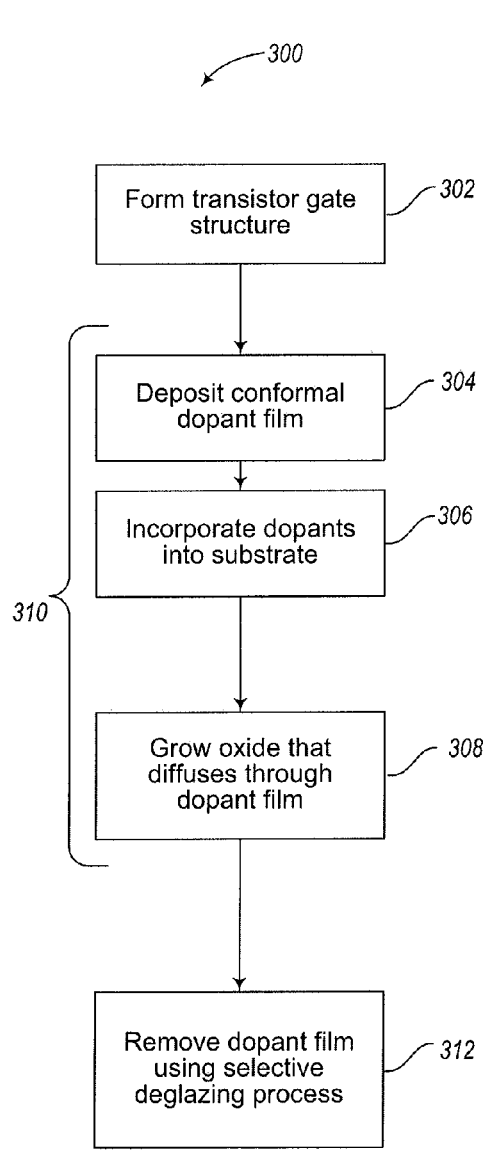
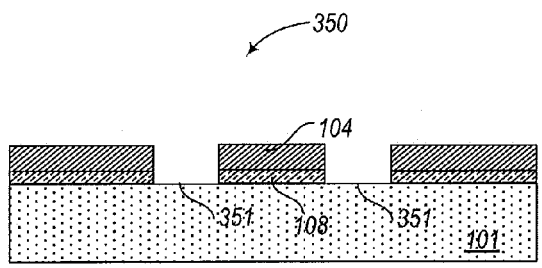
Fig. 3B
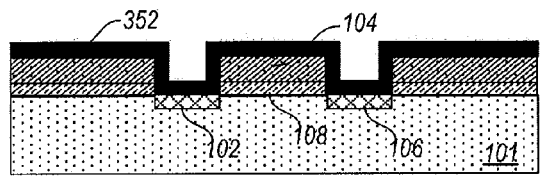
Fig. 3C
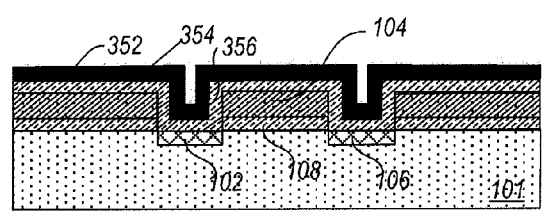
Fig. 3D
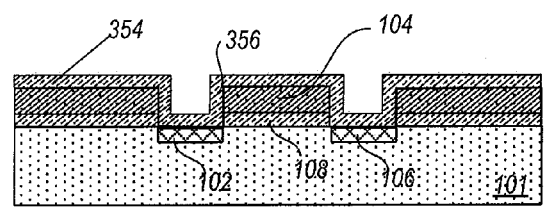
Fig. 3E
Fig. 3A

|       | SC1 x 9 | N-CLEAN | NH4OH |
|-------|---------|---------|-------|
| PT1   | 646     | 653     | 636   |
| PT2   | 656     | 652     | 629   |
| PT3   | 647     | 653     | 631   |
| PT4   | 644     | 648     | 634   |
| PT5   | 643     | 645     | 632   |
| MEAN  | 647.2   | 650.0   | 632.4 |
| STDEV | 5.2     | 3.4     | 2.7   |

METHOD OF SELECTIVELY DEGLAZING P205

BACKGROUND

1. Technical Field

The present disclosure relates to fabrication of metal oxide semiconductor field effect transistors (MOSFETs) in integrated circuits.

2. Description of the Related Art

An example of a scanning electron microscope (SEM) image of a MOSFET transistor built on a silicon substrate is shown in FIG. 1. The MOSFET transistor is a three-terminal electronic switching device in which an electric potential applied to a gate terminal controls the flow of current in a channel region between a source terminal and a drain terminal. The structure of the gate in a silicon MOSFET is that of a parallel plate capacitor in which the dielectric layer between the plates is a very thin, fragile, layer of silicon dioxide, sometimes as thin as about 10-20 Å. The purity and integrity of the gate oxide is a critical factor that determines device performance. The gate "plate" is typically made of polycrystalline silicon (polysilicon).

The source and drain are regions of the substrate that are electrically altered (doped) to have an excess of positive charge (PMOS) or negative charge (NMOS). Doping processes tend to be high energy processes that entail either diffusion of dopant atoms at extreme temperatures, or ion implantation of dopant atoms that are accelerated to high velocities. A common dopant used for NMOS devices, for example, is phosphorous, which can be introduced to the substrate in the form of a thin film of phosphorous pentoxide ($P_2O_5$) deposited on the silicon surface. Phosphorous atoms from the $P_2O_5$ film can be driven deeper into the silicon substrate by heating, to accelerate the diffusion process. The gate structure is typically fabricated prior to doping the source and drain regions, in part so that the gate structure can serve as a mask for the source and drain doping process.

One drawback of this fabrication sequence is that the gate oxide is vulnerable to damage from subsequent process steps, including high energy doping processes, film removal steps, and surface cleaning steps. During these removal and cleaning steps, gate oxide can be eroded laterally by various etchants, including hydrofluoric (HF) acid. The transistor shown in FIG. 1 exhibits this lateral erosion of the gate oxide, which can reduce transistor performance. If the gate oxide dielectric is undercut too far, relative to the edge of the overlying polysilicon gate, the dielectric can become ineffective and charge can leak from the poly gate to the substrate, causing degradation in transistor performance, and threatening product yields. Therefore, process flow solutions that mitigate gate-to-substrate leakage are of considerable interest.

BRIEF SUMMARY

One way to protect the gate oxide during subsequent processing is to maintain a protective conformal layer of oxide on top of the transistor device, including adjacent the gate oxide and over the source/drain regions. A conformal oxide layer reinforces the gate oxide against subsequent erosion.

One method that can be employed during fabrication of n-type devices that are doped with phosphorous includes depositing a conformal oxide layer in conjunction with the doping process, and using subsequent etching and cleaning steps that are selective to not remove the oxide layer. One such method, as disclosed herein, results in a protective oxide layer that has a graded profile, thus providing additional protection at the base of the transistor gate, next to the gate oxide.

The method disclosed preserves the conformal oxide layer through a selective deglazing step that is used to remove residual layers containing phosphorous from the device after the source and drain regions have been doped. This deglazing step employs a selective etching chemistry that can extract residual phosphorous dopants without attacking the surrounding oxide. The selective etching process involves a hydrolytic reaction and an acid-base neutralization reaction.

In one embodiment, the acid-base neutralization reaction includes an ammonium hydroxide component. In another embodiment, a concentrated SC1 clean can be used for selective deglazing. Using selective deglazing can eliminate the need for a subsequent oxidation step because the conformal oxide layer has been preserved.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 3A illustrates a process flow according to one embodiment.

FIGS. 3B-3E are side views of device profiles after each of a sequence of steps of the process according to one embodiment for creating the structure shown in FIG. 2, as taught herein.

DETAILED DESCRIPTION

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In the following description, certain specific details are set forth in order to provide a thorough understanding of various aspects of the disclosed subject matter. However, the disclosed subject matter may be practiced without these specific details. In some instances, well-known structures and methods of fabricating transistors comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to conformal films includes films that deposit material onto the sidewalls of underlying structures. The term "conformal" should not be construed narrowly to limit a conformal film solely to one that exactly mimics the shape below it, but rather, the term conformal is broadly construed to cover approximate conformity to underlying topography.

Specific embodiments are described herein with reference to a use of a hydrolytic reaction and an acid-base neutralization reaction as being parts of a selective etching chemistry for phosphorous; however, the present disclosure and the reference to these chemical equations used should not be limited to the exemplary reactants described.

Figure 1:
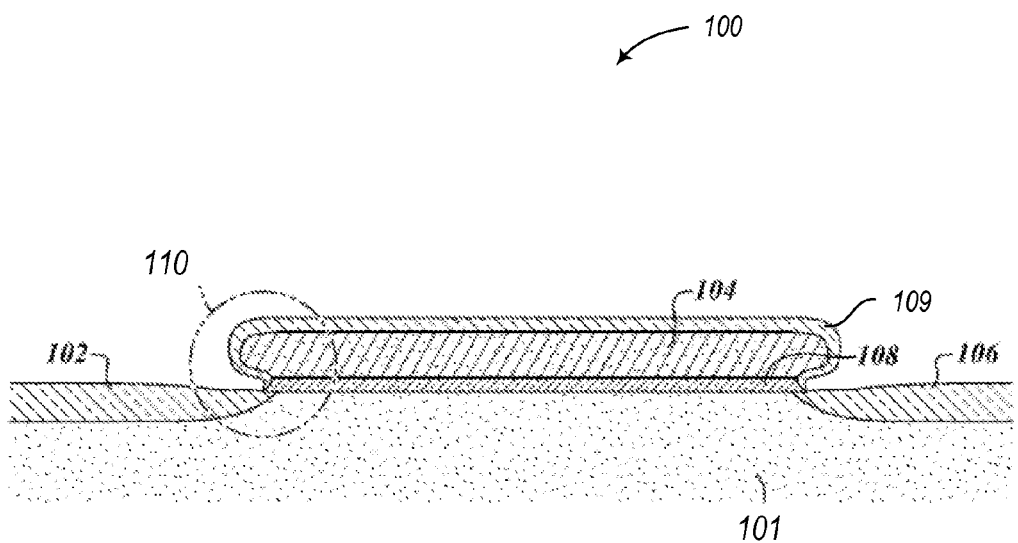
FIG. 1 is a side view of a transistor structure, derived from an actual SEM image, in which portions of the gate dielectric have been removed under the gate electrode as is common in the prior art.

FIG. 1 is derived from a SEM image of an actual prior art silicon NMOS transistor 100 that has increased charge leakage, called a leaky transistor herein. The leaky transistor 100 includes a silicon substrate 101, an n-doped source 102, a polysilicon transistor gate 104, an n-doped drain 106, and a gate dielectric 108 made of silicon dioxide ($SiO_2$). The transistor gate 104 was formed first, and then the source and drain regions, 102 and 106, respectively, were formed on either side of the gate 104, using the gate as a mask. N-type doping is typically achieved by exposing the masked silicon surface to compounds of phosphorous or arsenic. In the present example, a $P_2O_5$ film was deposited on the silicon substrate and heated to accelerate diffusion of dopants into the substrate 101. A sequence of processing steps that include a deglazing step to remove remnants of the $P_2O_5$ film was then carried out. From the image in FIG. 1, captured after the deglazing step, it is evident that the deglazing chemistry attacked the gate dielectric 108, causing lateral erosion, or significant undercut 110 (circled) of the gate oxide underneath the transistor gate 104. The presence of such a high degree of polysilicon gate undercut 110 can cause high gate-to-substrate current leakage during operation of the transistor 100.

Some transistors are formed with an additional conformal oxide layer 109 covering the transistor structure as a whole. A purpose of this additional conformal oxide layer 109 is to thicken the sidewalls of the gate oxide as a protection against erosion. A subsequent anisotropic (downward-directed) etch step can then remove the conformal oxide from on top of the polysilicon gate 104 and the substrate 101, while leaving the sidewall oxide in place to protect against further undercut. Even though the transistor 100 includes this additional conformal oxide layer 109, it was not enough to protect the gate dielectric 108 and prevent leakage.

Figure 2:
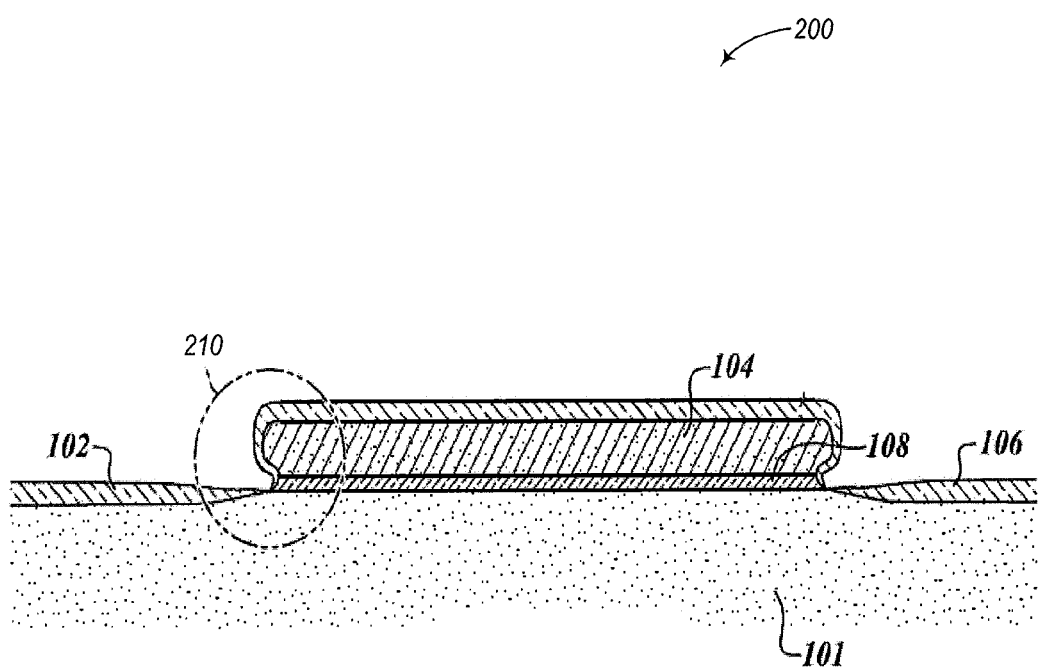
FIG. 2 is a side view of a transistor structure, derived from an actual SEM image, in which the gate dielectric underneath the gate electrode has been protected based on principles of the present invention.

FIG. 2 is derived from a SEM image of an improved NMOS transistor 200 made using the techniques taught herein. The improved NMOS transistor 200 was fabricated using a process that includes a different $P_2O_5$ deglazing step and a different sequence of processing steps that does not result in a high degree of undercut. Instead, the region at the base of the transistor gate 104 retains a more vertical and robust gate oxide profile 210. Consequently, the electrical performance of the NMOS transistor 200 is improved, compared with the performance of the transistor 100. There is also less of a bird's beak formation present at the interface of the substrate and gate oxide in the present embodiment.

FIG. 3A shows a sequence 300 of process steps 302, 304, 306, 308, and 310 that can be used to form the improved NMOS transistor 200. A sequence of cross-sectional diagrams 350 shown in FIGS. 3B-3E indicate the shapes and relative dimensions of device profiles after each process step or group of steps are completed. The process of interest in the present disclosure begins after the transistor gate 104, illustrated in FIG. 3B, is already formed at step 302. Exposed areas 351 of the silicon substrate 101 shown in FIG. 3B are now ready to receive a dose of n-type material.

In step 304, a conformal dopant film 352 can be deposited, for example, the $P_2O_5$ film described above. The $P_2O_5$ deposition can occur, for example, in a diffusion furnace at a temperature within the range of about 800-1200 degrees centigrade (C). In step 306, n-type dopants (in this case, phosphorous atoms) originating in the dopant film 352 are diffused into the silicon substrate 101 beneath the exposed areas 351 by heating the device to a temperature within the range of about 750-1000 C, thus forming the n-doped source and drain regions, 102 and 106, respectively. As the concentration of phosphorous dopants increases in the source and drain regions, the $P_2O_5$ dopant film 352 might become somewhat depleted of phosphorous, as some of the phosphorous moves from the film to the substrate.

In step 308, an oxide layer 354, e.g., $SiO_2$, can be grown, also conformally, on the silicon substrate 101, as shown in FIG. 3D. The thickness of the conformal oxide layer 354 can be, for example, in the range of 0.1-0.5 microns for a gate that is about 3.0 microns wide. When a silicon substrate is subjected to an oxygen-containing atmosphere, such as steam, a dry $O_2$ gas environment, and the like, an $SiO_2$ layer will grow at the silicon surface, combining the silicon and the oxygen. The oxygen can now easily diffuse through the $P_2O_5$ dopant film 352 so that a layer of $SiO_2$ grows underneath the dopant film 352, creating a layer of $SiO_2$ on the surface of the substrate and between the $P_2O_5$ layer and the substrate. Thus, the $SiO_2$ is in contact with the source and drain regions, 102 and 106, respectively, and also accumulates at the sidewalls 356 of the polysilicon gate 104. Maintaining this additional oxide sidewall 356 is advantageous in guarding against gate oxide erosion in subsequent process steps.

It may be advantageous to group steps 304, 306, and 308 into a single, source/drain doping-and-oxidation combined process step 310. Execution of the combined process step 310 is possible because all three processes (depositing a dopant film 304, incorporating dopants into the substrate 306, and oxidation 308) can be carried out in the same environment (e.g., a diffusion furnace), as sequential steps of a common recipe or procedure. For example, the formation temperature of the $P_2O_5$ layer may be sufficient to cause the diffusion of phosphorous into the silicon substrate as the layer is formed, avoiding a separate heating and diffusing step. Also the atmosphere for forming the $SiO_2$ layer can be achieved immediately following the formation of the $P_2O_5$ layer by merely removing the phosphorous from the furnace and letting oxygen continue to flow as a gas, thus making the transition from forming the $P_2O_5$ layer to forming the $SiO_2$ layer by the removal of the source of phosphorous from the furnace, which may or may not be accompanied by a change in temperature. An opportunity to combine processing steps generally improves product throughput and decreases processing costs, thus saving both time and money.

Following oxidation, residual P₂O₅ dopant film 352 is then removed by a deglazing process, in step 312. It is well known in the art that oxide removal is reliably accomplished using a hydrofluoric acid (HF) wet etch process. However, HF consumes $SiO_2$ at a very fast rate, which is undesirable at this point in the process flow, because of the continued vulnerability of the fragile gate oxide 108. It is therefore more desirable to remove residual phosphorous-containing dopant material using an alternative (e.g., non-HF) etch chemistry that can preserve the sidewall oxide 356.

$P_2O_5$ is known to persons of skill in the art of chemistry as a potent dehydrating agent, meaning that $P_2O_5$ can be used to extract water from various substances. The inventors realized that the reciprocal effect may also hold: water can be used to extract residual phosphorous from the depleted $P_2O_5$ film 352 shown in FIG. 3D without attacking the oxide layer 354. Removing the residual phosphorous in the $P_2O_5$ layer can thus be accomplished by a deglazing process that involves a hydrolytic surface reaction, according to the chemical equation (1):

$$P_2O_5 + H_2O \rightarrow 2H_3PO_4 (-\Delta kJ). \quad (1)$$

Equation (1) shows that the product of reacting $P_2O_5$ and water is an acid, $H_3PO_4$. A base such as, for example, ammonium hydroxide ($NH_4OH$), can then be used to neutralize the acidic product of the reaction described in equation (1), according to the chemical equation (2):

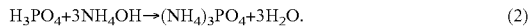

$$H_3PO_4 + 3NH_4OH \rightarrow (NH_4)_3PO_4 + 3H_2O. \quad (2)$$

Other basic substances can be substituted for the $NH_4OH$ in the acid-base neutralization reaction (2). However, ammonium hydroxide is a convenient choice because it is commonly used in the semiconductor industry, and it is known to persons of skill in the art of semiconductor processing. In an alternative embodiment, water may be used to treat the surface, followed by ammonium hydroxide, followed by a water wash step. If necessary, further modifications of equation (2) (e.g., adding reactants) can mitigate collateral damage to the silicon substrate.

A common source of $NH_4OH$ used in semiconductor processing is the liquid chemical solution called "SC1" which is a mixture of ammonium hydroxide, peroxide, and water. SC1 etching, or "cleaning" is typically done by immersing a batch of one or more substrates in a bath of the SC1 solution at a particular temperature, volume, and flow rate, and for a predetermined time. One alternative method of exposure of the substrate to the chemical is by spraying the liquid solution onto the substrate. Another alternative method of exposing the substrate to the chemical is to use a vapor process or a plasma-assisted etching process. $P_2O_5$ removal can entail any of these or other alternative processing environments that facilitate the hydrolytic reaction (1) and the acid-base neutralization reaction (2).

Based on the theory provided by equations (1) and (2), SC1 was chosen as a starting point in developing a selective wet etch chemistry for deglazing the residual $P_2O_5$ film without attacking the $SiO_2$, and in particular, the sidewall oxide 356. A concentrated form of SC1 ("N-clean") was shown to increase the $P_2O_5$ removal rate substantially while still preserving oxide. Namely, the amount of $NH_4OH$ was increased relative to the amount of water to provide a mixture with a much higher concentration of $NH_4OH$. Once a selective etch chemistry is determined, and a processing environment is chosen, process parameters and process conditions (e.g., concentrations, temperatures, flow rates, etc), can be adjusted to produce a process recipe that provides a desirable etch rate with a high degree of spatial uniformity, and consistency over multiple trials. Experimental design using statistics can help indicate a set of possible process conditions that warrant further testing.

Figure 4:
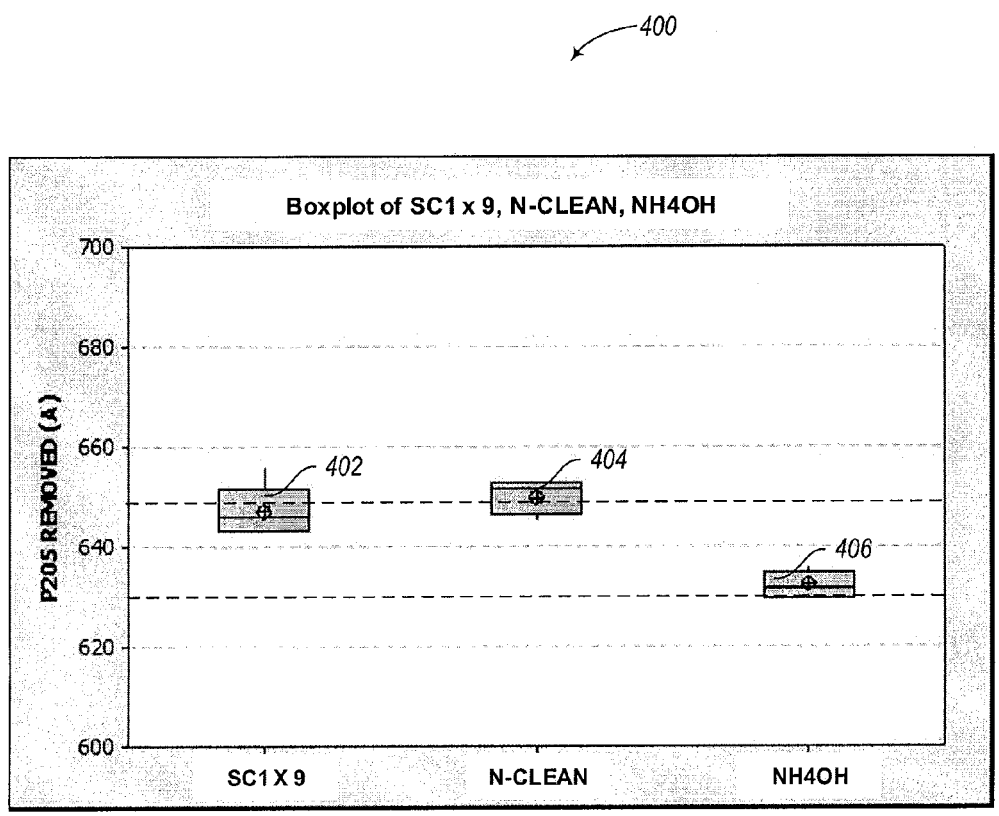
FIG. 4 is a plot showing amounts of $P_2O_5$ removed by each of three candidate etch chemistries.

FIG. 4 shows a statistical "box plot" comparison 400 of three candidate chemical solutions for etching test substrates using both of the reactions (1) and (2): conventional SC1; the concentrated "N-clean"; and a trial solution of ammonium hydroxide and water (i.e., SC1 without the peroxide component). A standard technique for measuring etch rates in general uses substrates that are blanket-deposited with a known thickness of a film to be etched, in this case $P_2O_5$. The film thickness can be measured before and after the film removal treatment, and the etch rate can then be calculated as the difference (i.e., decrease) in film thickness divided by the processing time.

According to FIG. 4, for a given processing time, a film thickness 402 of approximately 650 Å of $P_2O_5$ was removed by the SC1 chemistry×9 (i.e., 9 consecutive runs or 9 times the standard processing time). Likewise, a film thickness 404 of approximately 650 Å of $P_2O_5$ was removed by the N-clean chemistry on a single run, which indicates the N-clean chemistry can be considered 9× more potent than the SC1 chemistry. Meanwhile, the ammonium hydroxide alone had a slightly lower etch rate, removing a film thickness 406 of about 630 Å of a $P_2O_5$ sample film in the same period of time.

Figures 5A, 5B:
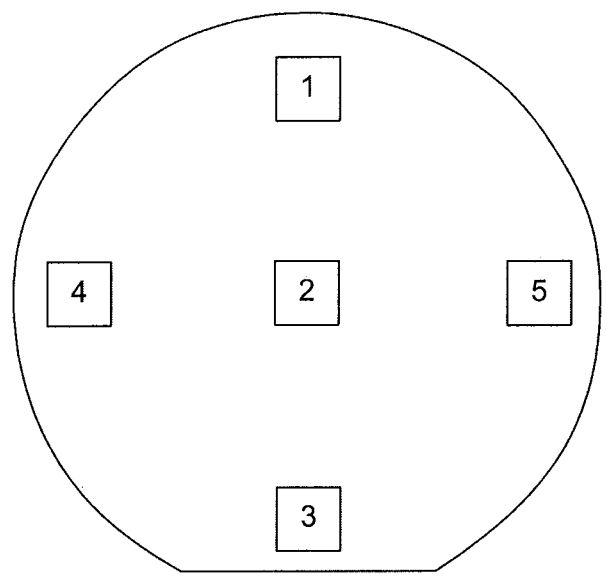
FIGS. 5A-5B illustrate the removal rate and uniformity of the three candidate deglaze processes of FIG. 4.

FIG. 5A is a data table listing numerical data that correspond to the box plot shown in FIG. 4. For each of the three candidate chemistries, five samples were measured, each at a different location on the test substrate, as shown in FIG. 5B. Data point "PT2" reflects a measurement taken at the center of the test substrate, and the other data points PT1, PT3, PT4, and PT5 were gathered from locations at the edge of the substrate. Statistics calculated for the five data points are shown in FIG. 5A, and they are also indicated in the box plot of FIG. 4. For example, the dot in the center of each box in FIG. 4 represents the calculated mean film thickness removed at each of the five locations on the test substrate, and the height of the box represents the standard deviation between the five trials. A comparison of the center value and the edge values indicates the cross-substrate (spatial) uniformity of the process.

Figure 6A:
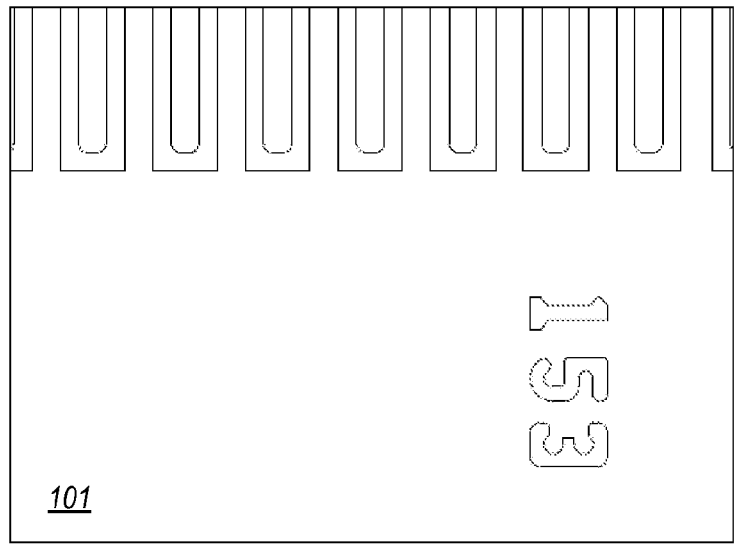
FIGS. 6A-6B are plan views of the surface of the substrate after treatment using a selective deglazing process.
Figure 6B:
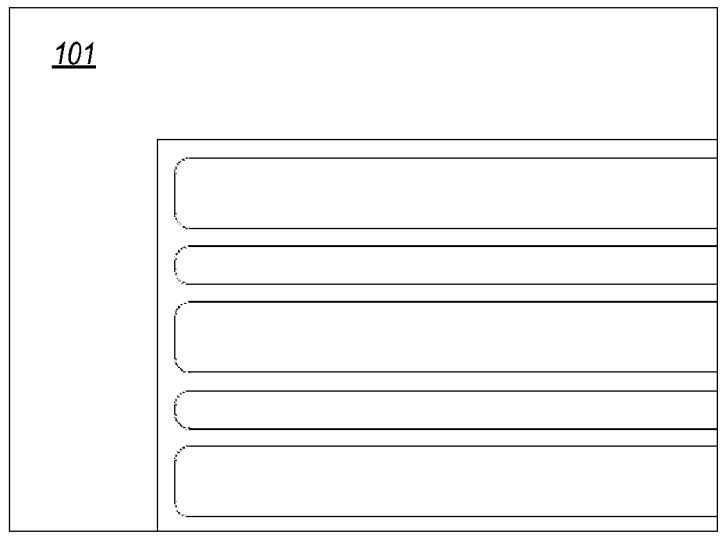

FIGS. 6A and 6B are plan views derived from SEM micrograph images that show the quality of the surface features formed on the substrate 101 using the two etch chemistries "N-clean" (FIG. 6A) and ammonium hydroxide (FIG. 6B). The difference between the two chemistries is the presence of hydrogen peroxide ($H_2O_2$) which is present only in the N-clean solution (FIG. 6A). The addition of peroxide can sometimes be used to prevent ammonium hydroxide from attacking the silicon substrate. No visual differences or abnormalities are evident from an inspection of either FIG. 6A and or FIG. 6B, however. These empirical results reinforce the theory that the active ingredient in the process solution is the ammonium hydroxide, not the peroxide. Thus, both the SC1 solution and the NH4OH-only solution are viable chemistries for the desired $P_2O_5$ deglaze process to remove this material and leave only the $SiO_2$.

Figure 7:
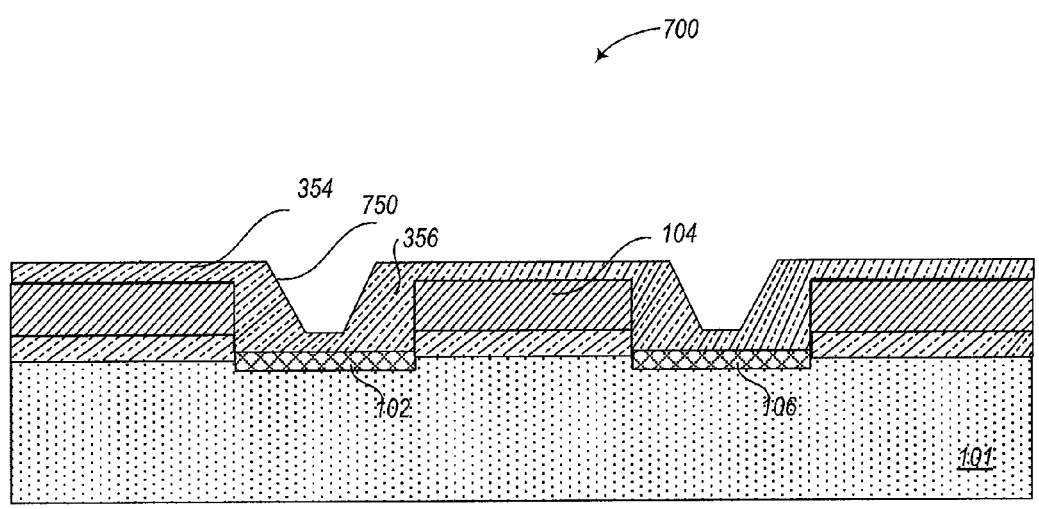
FIG. 7 is a side view of a device profile produced by the process described in FIGS. 3A-6B.

The resulting structure 700, following the deglazing process 312, is shown in greater detail in FIG. 7. Because the oxide layer 354 has been preserved by using the selective deglazing chemistry in step 312, the sidewall oxide 356 is thicker at the bottom, near the gate oxide, than at the top. Thus, the resulting oxide profile is a slanted, or "graded" profile 750.

If an HF-based deglazing chemistry had been used to remove the oxide layer 354, an additional source/drain oxidation step would have been required, following the deglazing step 312, to replace the conformal oxide layer 354 and to fill in the undercut of the gate electrode. Whereas, if the "N-clean" chemistry is used in the deglaze step 312, this additional oxidation step is not needed. The oxide layer grown in step 308 remains. Again, product throughput is increased, saving both time and money.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a field effect transistor, the method comprising:
   forming a gate dielectric layer overlying a silicon substrate;
   forming a gate electrode overlying and directly in contact with the gate dielectric;
   forming a dopant film layer overlying the silicon substrate adjacent to the gate dielectric;
   incorporating dopants from the dopant film into the substrate to create doped source and drain regions of the transistor;
   growing a silicon oxide layer over the source and drain regions, in direct contact with the silicon semiconductor substrate; and
   removing the dopant film using a deglazing process that is selective to the silicon oxide layer.

2. The method according to claim 1, wherein the gate is made of polysilicon.

3. The method according to claim 1, wherein the step of incorporating includes heating the substrate.

4. The method according to claim 1, wherein the dopant film includes phosphorous and the transistor is an n-type transistor.

5. The method according to claim 1, wherein the dopant film includes arsenic and the transistor is an n-type transistor.

6. The method according to claim 1, wherein the step of removing includes a hydrolytic reaction and an acid-base neutralization reaction.

7. The method according to claim 6, wherein the acid-base neutralization reaction includes ammonium hydroxide.

8. The method according to claim 7 wherein the acid-base neutralization reaction further includes hydrogen peroxide.

9. A method of forming an n-type field effect transistor on a substrate, comprising:
   forming a gate on the substrate, including a gate oxide;
   using the gate as a mask, doping portions of the substrate with an n-type dopant layer to form n-type source and drain regions;
   growing a conformal oxide layer in contact with the gate oxide; and
   removing residual amounts of the n-type dopant layer using a hydrolytic reaction that is selective to the oxide layer.

10. The method of claim 9, wherein the doping step and the step of growing a conformal oxide layer are executed as sequential parts of the same processing recipe.

11. The method according to claim 9, further comprising neutralizing an acidic product of the hydrolytic reaction.

12. The method according to claim 11, wherein the neutralizing includes ammonium hydroxide as a reactant.

13. The method according to claim 12, wherein the neutralizing further includes hydrogen peroxide as a reactant.

14. The method of claim 9, wherein the n-type dopant is phosphorous.

15. The method of claim 9, wherein the n-type dopant is arsenic.

16. The method of claim 9, wherein the substrate is silicon and the gate is polysilicon.

* * * * *